United States Patent
Ott

(10) Patent No.: US 10,511,469 B2
(45) Date of Patent: Dec. 17, 2019

(54) SYNTHESIZER

(71) Applicant: Sony Corporation, Tokyo (JP)

(72) Inventor: Arndt Thomas Ott, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/274,265

(22) Filed: Feb. 13, 2019

(65) Prior Publication Data
US 2019/0260617 A1 Aug. 22, 2019

(30) Foreign Application Priority Data

Feb. 20, 2018 (EP) ..................................... 18157705

(51) Int. Cl.

| H04B 1/00 | (2006.01) |
|---|---|
| H04L 27/10 | (2006.01) |
| H04L 27/20 | (2006.01) |
| H03C 3/09 | (2006.01) |
| G01S 7/35 | (2006.01) |
| H03L 7/093 | (2006.01) |
| G01S 13/34 | (2006.01) |

(52) U.S. Cl.
CPC .............. H04L 27/103 (2013.01); G01S 7/35 (2013.01); G01S 13/343 (2013.01); H03C 3/095 (2013.01); H03C 3/0925 (2013.01); H03C 3/0966 (2013.01); H03L 7/093 (2013.01); H04L 27/2003 (2013.01)

(58) Field of Classification Search
CPC ..... H04L 27/103; H04L 27/2003; G01S 7/35; G01S 13/343; H03C 3/0925; H03C 3/095; H03C 3/0966; H03L 7/093

USPC ................ 375/139, 132, 130, 219, 295, 316
See application file for complete search history.

(56) References Cited

U.S. PATENT DOCUMENTS

| 7,378,918 B2 | 5/2008 | Hirano et al. |
| 7,902,891 B1 | 3/2011 | Miyanaga et al. |
| 8,427,243 B2 | 4/2013 | Chen et al. |

(Continued)

FOREIGN PATENT DOCUMENTS

EP 2 782 255 A1 9/2014

OTHER PUBLICATIONS

Best, R., "Phase-Locked-Loops Design, Simulation, and Applications", Mcgraw-Hill, 2 Pages total, (2007).

(Continued)

Primary Examiner — Zewdu A Kassa
(74) Attorney, Agent, or Firm — Xsensus LLP

(57) ABSTRACT

A synthesizer comprises a first two-point modulation phase locked loop, TPM PLL, circuit that receives a first reference clock signal at a first reference frequency and a feedback signal at a feedback frequency and generates a first chirp signal by applying a two-point modulation PLL on the first reference clock signal, a second integer-n TPM PLL circuit that receives a second reference clock signal at a second reference frequency lower than the first reference frequency and generates a second chirp signal by applying a TPM PLL on the second reference clock signal, a mixer that down-converts the first chirp signal by the second chirp signal to obtain the feedback signal at the feedback frequency corresponding to the difference of the frequency of the first chirp signal and the second chirp signal, and a feedback path that feeds back the feedback signal to the first TPM PLL circuit.

12 Claims, 6 Drawing Sheets

(56) References Cited

U.S. PATENT DOCUMENTS

| | | |
|---|---|---|
| 8,446,191 B2 | 5/2013 | Dunworth et al. |
| 8,531,219 B1 | 9/2013 | Dunworth et al. |
| 8,654,006 B2 | 2/2014 | Landez et al. |
| 8,731,502 B2 | 5/2014 | Salle et al. |
| 8,866,667 B2 | 10/2014 | Vacanti |
| 8,884,672 B2 | 11/2014 | Ballantyne et al. |
| 2017/0141857 A1* | 5/2017 | Casagrande ........... H04B 17/11 |

OTHER PUBLICATIONS

Komarov, I., et al., "Fundamentals of Short-Range FM Radar," Artech House, 313 Pages total, (2003).

Li, Y-A., et al., "A Fully Integrated 77GHz FMCW Radar System in 65nm CMOS", 2010 IEEE International Solid-State Circuits Conference, 3 Pages total, (2010).

Markulic, N., et al., "A Self-Calibrated 10Mb/s Phase Modulator with -37.4dB EVM Based on a10.1-to12.4GHz, -246.6dB-FOM, Fractional-N Subsampling PLL", 2016 IEEE International Solid-State Circuits Conference, 3 Pages total, (2016).

Raczkowski, K., et al., "A 9.2-12.7 GHz Wideband Fractional-N Subsampling PLL in 28nm CMOS With 280 fs RMS Jitter", IEEE International Solid-State Circuits Conference, vol. 50, No. 5, 11 Pages total, (May 2015).

Wu, W., et al., "Millimeter-Wave Digitally-Assisted Frequency Synthesizer in CMOS", TU DELFT, 196 Pages total, (Sep. 2013).

Xu, N., et al., "A Digital-Intensive F/PLL-based Two-Point Modulator with a Constant-Gain DCO for Linear FMCW Generation", 2015 IEEE International Symposium on Radio-Frequency Integration Technology, 3 Pages total, (2015).

Yeo, H., et al., "A 940MHz-Bandwidth 28.8us-Period 8.9GHz Chirp Frequency Synthesizer PLL in 65nm CMOS for X-Band FMCW Radar Applications", 2016 IEEE International Solid-State Circuits Conference, 3 Pages total, (2016).

* cited by examiner

SYNTHESIZER

CROSS-REFERENCE TO RELATED APPLICATIONS

This application claims the benefit of priority of the European Patent Application No. 18157705.7 filed with the European State Intellectual Property Office on Feb. 20, 2018, the entire disclosure of which is incorporated herein by reference.

BACKGROUND

Field of the Disclosure

The present disclosure relates to a synthesizer.

Description of Related Art

Fast chirp modulation schemes are required for future radars. Current Frequency-Modulated Continuous-Wave (FMCW) synthesizers employ fractional-n PLL synthesizers. However, fractional-n and integer-n PLL synthesizers are limited with respect to chirp speed as these PLLs provide a low-pass characteristic. Two point modulated (TPM) synthesizers overcome these problems as the frequency is additionally tuned at a voltage controlled oscillator (VCO), which enables an all-pass characteristic of the PLL. Further, the PLL remains locked during the entire chirp sequence. However, two-point modulated PLLs can only approximate a linear frequency modulation with discrete frequency steps. This impairment leads to unwanted ghost targets in the radar image. Further, the two-point modulation PLLs are limited in terms of chirp speed and signal quality. Further, a considerable problem of TPM PLL synthesizers is the frequency error of the PLL which occurs due to the limited dynamic range of the digital to analog converter (DAC) which provides the additional tuning voltage for the VCO.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a synthesizer that reduces or even avoids the generation of unwanted ghost targets and is improved in terms of chirp speed, signal quality and phase noise.

According to an aspect there is provided a synthesizer comprising a first two-point modulation phase locked loop, TPM PLL, circuit configured to receive a first reference clock signal at a first reference frequency and a feedback signal at a feedback frequency and to generate a first chirp signal in a first mm-wave frequency range by applying a two-point modulation PLL on the first reference clock signal, a second integer-n TPM PLL circuit configured to receive a second reference clock signal at a second reference frequency lower than the first reference frequency and to generate a second chirp signal in a second mm-wave frequency range by applying a two-point modulation PLL on the second reference clock signal, a mixer configured to downconvert the first chirp signal by the second chirp signal to obtain the feedback signal at the feedback frequency corresponding to the difference of the frequency of the first chirp signal and the second chirp signal, and a feedback path configured to feed back the feedback signal to the first TPM PLL circuit.

Embodiments are defined in the dependent claims.

One of the aspects of the disclosure is to use a novel two point modulated PLL concept in a synthesizer, which can be manufactured in CMOS technology. The synthesizer concept comprises of two two-point modulation PLLs. Down conversion in the low frequency feedback path is achieved by mixing. Different reference frequencies are applied at both PLLs although the reference clocks are preferably synchronized. A control unit may be applied for simultaneous adjustment of both PLLs to reduce the impact of the frequency error on the chirp signal.

In general, modern TPM PLLs provide a low or moderate loop filter bandwidth. Due to the mixing concept and the integer division ratio in the second PLL we can considerably increase the loop filter bandwidth and hence improve the phase noise.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
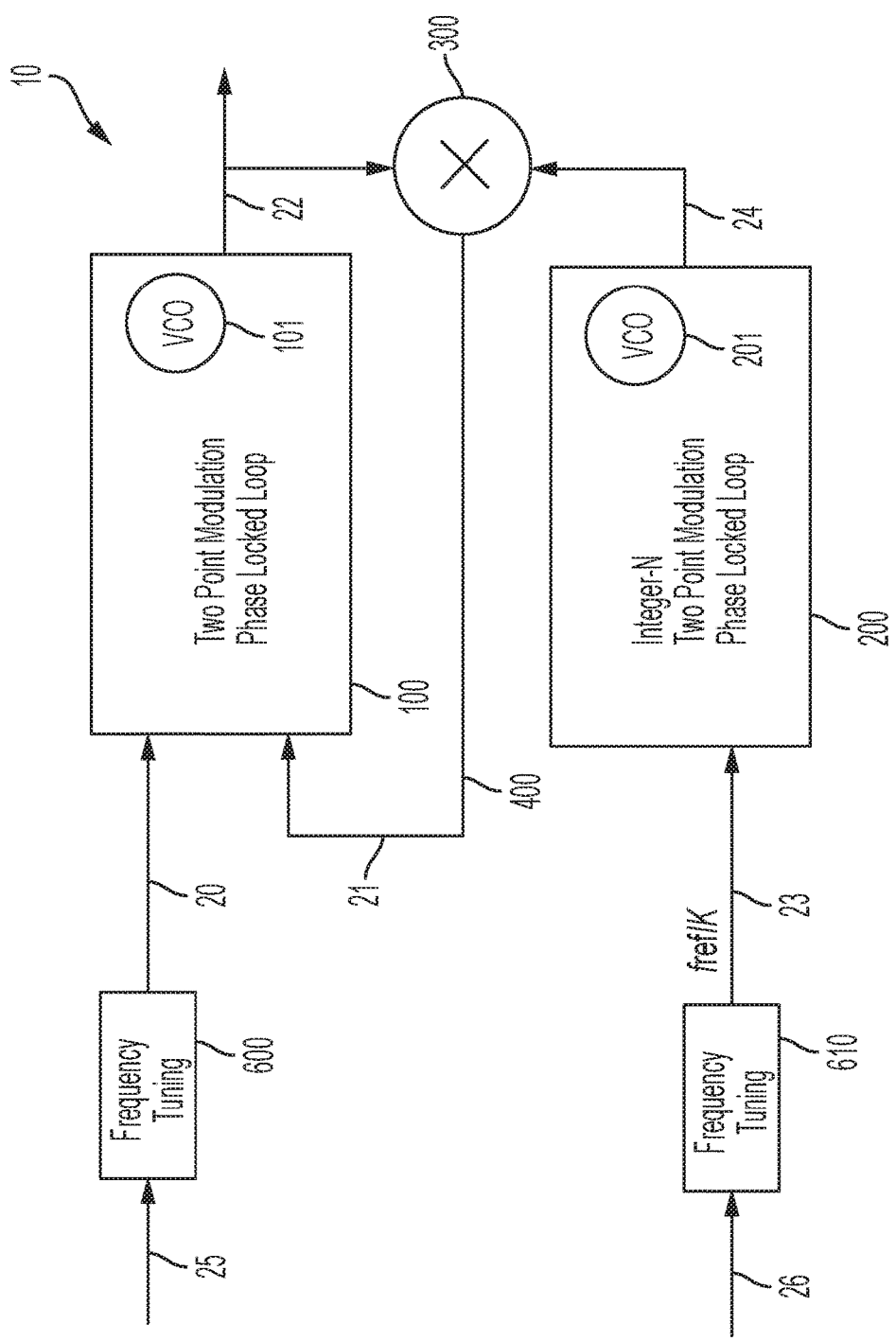
FIG. 1 shows a schematic diagram of a first embodiment of a synthesizer according to the present disclosure.

Referring now to the drawings, wherein like reference numerals designate identical or corresponding parts throughout the several views, FIG. 1 shows a schematic diagram of a first embodiment of a synthesizer 10 according to the present disclosure. The synthesizer 10 comprises a first two-point modulation (TPM) phase locked loop (PLL) circuit 100, a second integer-n TPM PLL circuit 200, a mixer 300 and a feedback circuit 400.

The first TPM PLL circuit 100 is configured to receive a first reference clock signal 20 (also called tuned reference signal $f_{tune}$) at a first reference frequency (e.g. at approx. 240 MHz) and a feedback signal 21 at a feedback frequency (e.g. at 240 MHz) and to generate a first chirp signal 22 in a first mm-wave frequency range (e.g. at approx. 77 GHz) by applying a two-point modulation PLL on the first reference clock signal 20. The second integer-n TPM PLL circuit 200 is configured to receive a second reference clock signal 23 (also called low speed reference clock $f_{ref}/K$) at a second reference frequency (e.g. at a frequency below 80 MHz) lower than the first reference frequency and to generate a second chirp signal 24 in a second mm-wave frequency range (e.g. at approx. 77.24 GHz) by applying a two-point modulation PLL on the second reference clock signal 23. Generally, the second reference clock signal 23 shall be larger than the loop bandwidth of the first PLL 100. The loop bandwidth of the first PLL 100 should exceed 10 MHz. A good number for the reference frequency is of the second reference clock signal 23 is between 20 MHz and 80 MHz which corresponds to K=3, ..., 12. The individual steps of the chirps are generated by a frequency tuning circuit 600, as will be explained in more detail below.

The mixer 300 is configured to downconvert the first chirp signal 22 by the second chirp signal 24 to obtain the feedback signal 21 at the feedback frequency corresponding to the difference of the frequency of the first chirp signal 22 and the second chirp signal 24 (e.g. 240 MHz in the above mentioned example). The feedback path 400 is configured to feed back the feedback signal 21 to the first TPM PLL circuit 100.

Hence, according to the present disclosure the concept of two point modulation is applied to achieve a high frequency accuracy of both PLLs 100, 200, each generally comprising a voltage controlled oscillator (VCO) 101, 201. Signals from the mm-wave VCOs are downconverted by a mixer to maintain sufficient frequency step size and low phase noise.

The PLL 100 is followed by a mixer 300 in the feedback path 400. The frequency tuning of the first reference signal 25 happens in an integer fashion. Therefore, no sigma delta modulators or oversampling concepts are required.

Known two-point modulation PLLs make use of a calibration of the high frequency feedback path and use conventional techniques in the low frequency feedback path. The present disclosure, in contrast, provides a synthesizer including two two-point modulation PLLs, which are preferably tuned in an integer fashion. Down-conversion in the low frequency feedback path 400 is achieved by mixing. Different reference frequencies (through the reference clock signals 20, 23) are applied at both PLLs 100, 200, wherein the reference clocks are preferably synchronized. The first PLL circuit 100 operating with high reference frequency (e.g. in the range of 100 MHz to 1 GHz, e.g. 240 MHz) provides low phase noise of the synthesizer 10. The other PLL circuit 200 operates at a lower reference clock (e.g. in the range of 20 MHz to 80 MHz, e.g. 40 MHz), which may correspond to the update rate of the FMCW chirp signal. Therefore, a low frequency error is achieved.

The frequency steps of the chirps are generated by a frequency tuning circuit 600. Due to the mixing process in the feedback path the frequency resolution of the frequency tuning block is identical to the frequency resolution at the first VCO output 22 e.g. 1 MHz. To achieve a large chirp bandwidth e.g. 4 GHz, the second PLL 200 is adjusted to keep the frequency tuning signal 20 in reasonable range e.g. 200 MHz-300 MHz. Frequency adjustment might be applied in the frequency tuning circuit 600 and the second PLL 200 from the lowest to the highest operating frequencies with consecutive steps (signals 20 and 24). Another solution is to adjust signals 20 and 24 to minimize the frequency error of every individual chirp frequency step.

An optional control unit 500 may be applied for simultaneous adjustment of both PLL circuits 100, 200 by use of control signals 27 and 28, as provided in the second embodiment of a synthesizer 11 according to the present disclosure. Frequency error and spurs can be reduced by applying dithering techniques.

Further, one or more optional frequency tuners may be provided for tuning one or both of the reference clock signals 20, 23. In particular, a first frequency tuning circuit 600 may be provided that is configured to tune the first reference clock signal 20 before reception by the first TPM PLL circuit 100, i.e. that receives a first high-speed reference signal 25 ($f_{ref}$) and outputs the tuned reference signal 20 ($f_{tune}$). Similarly, a second frequency tuning circuit 610 may be provided that is configured to tune the second reference clock signal 23 before reception by the first TPM PLL circuit 200, i.e. that receives a second reference signal 26 and outputs the tuned reference signal 23. In other embodiment no or only one of the frequency tuners 600, 610 may be provided. The one or more frequency tuning circuit(s) 600, 610 may also be controlled by the optional control unit 500 by control signal(s) 29. It may further be provided that frequency switching in the second frequency tuning circuit 610 is also achieved in an integer fashion. Without the second frequency tuning circuit 610 tuning of the second PLL 200 is achieved by switching the division ratio in the feedback path and simultaneous adjustment of the second VCO 201 due to two-point modulation.

The synthesizer according to the present disclosure overcomes the current limitations in terms of chirp speed, signal quality and phase noise. Fast chirps with very low frequency error are generated by the proposed synthesizer architecture. Simulations of the PLL architecture show that the generation of chirps with a ramp duration of 10 us/GHz is possible by maintaining a low RMS frequency error of 0.04%.

In an embodiment two-point modulated PLL circuits with increased low frequency path loop bandwidth are used. Further, an architecture is provided to realize the low frequency path of two-point modulated PLL synthesizers for FMCW radars. Fractional frequency division limits the chirp speed considerably due to the required oversampling and introduces additional noise into the PLL. Therefore, fractional frequency dividers and sigma delta modulator logic are avoided. In contrast, known PLLs are either tuned at their reference or feedback clock. When such kind of PLL is employed for linear FMCW modulation, a linear dependency between the reference clock and the mm-wave oscillator or a linear dependency between divider ratio in the feedback path and the operating frequency of the mm-wave oscillator are given:

$$f_{VCO} = N\, P_{ref} \tag{1}$$

In equation (1) $f_{VCO}$ is the operating frequency of the mm-wave oscillator, N describes the frequency multiplication factor of the PLL and $f_{ref}$ is the operating frequency of the reference oscillator. Hence, the frequency step size which is introduced at the VCO $$\Delta f_{VCO} = N \Delta f_{ref}$$

is a linearly scaled version of the step size at the reference oscillator $\Delta f_{ref}$. To achieve these very small frequency steps of the reference oscillator fractional division ratios are required which introduce noise to the PLL and reduce the locking time significantly. The mixing concept overcomes this problem as the resulting frequency step at the VCO is identical to the introduced frequency step at the reference.

Figure 3:
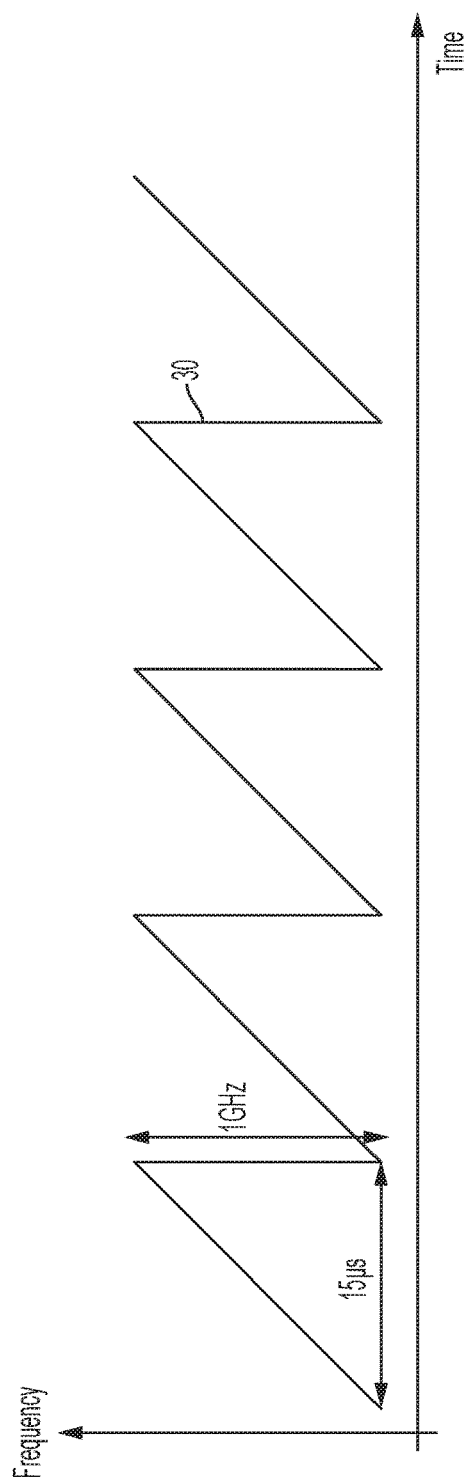
FIG. 3 shows a diagram of a typical sawtooth chirp sequence, which is targeted by modern radar synthesizers.
Figure 4:
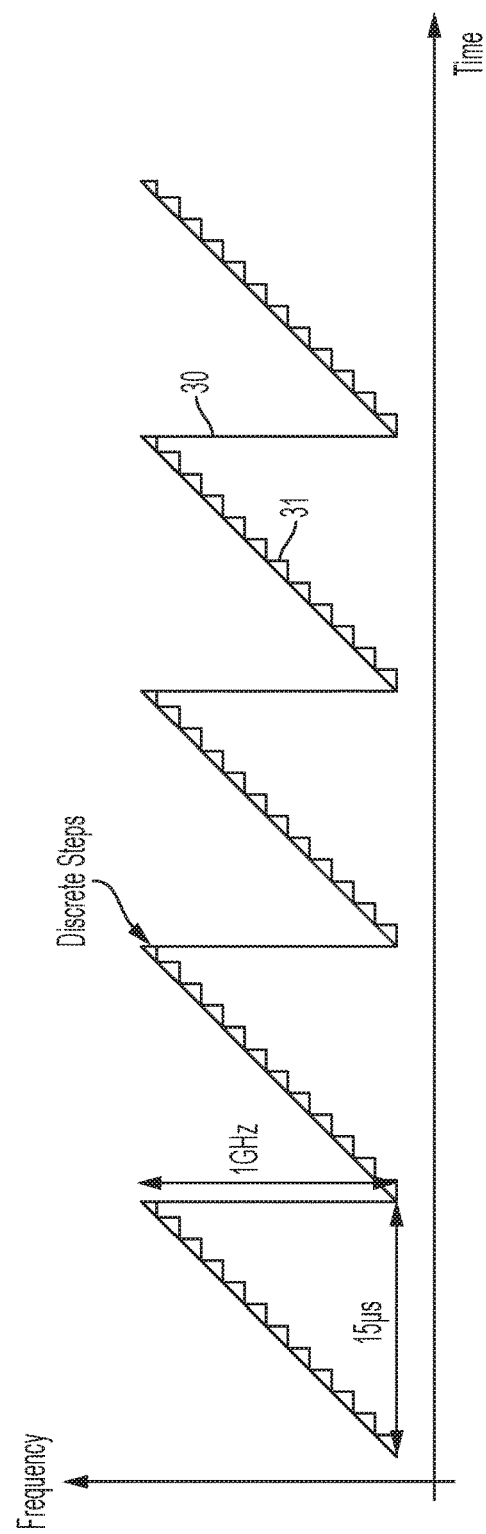
FIG. 4 shows a diagram of an approximation of the chirp shown in FIG. 3 with discrete frequency steps.

Generally, fast chirp synthesizers are designed to generate sawtooth waveforms as shown in FIG. 3 depicting an exemplary sawtooth chirp signal 30. Depending on the requirements and application of the radar the chirp signal can be synthesized as a staircase stepped frequency waveform as shown in FIG. 4 depicting the exemplary sawtooth chirp signal 30 and a stepped frequency approximation signal 31.

Different reference frequencies are generally applied at both PLLs 100, 200, but the reference clocks are preferably synchronized. The reference clock frequencies may thus be defined in the following way:

$$f_{ref} > f_{Update} >> f_{ref}/K,$$

where $f_{Update}$ is the update or step rate of the FMCW chirp signal 22. The high speed reference clock (25) is K times larger than the reference frequency of the low speed reference clock (23), which is applied to the PLL 200 driving the local oscillator signal of the mixer. Therefore, the required frequency resolution for the mm-wave outupt signal 22 is achieved.

Reduction of the synthesizer frequency error is achieved by a synchronous frequency adjustment of the low speed reference clock ($f_{ref}/K$) and the high speed reference clock ($f_{ref}$). Hereby, K may be selected such that it leads to a low speed reference clock, which is larger than the loop bandwidth of the first PLL 100. The loop bandwidth of the first PLL 100 should be larger than 10 MHz. Hence, a good number for the low speed reference frequency is between 20 MHz and 80 MHz which corresponds to K=3, ..., 12. Generally, K should be in the range from 1 to 20. However, these are only exemplary numbers depending on which frequency the mm-wave VCOs 101, 102 are operating.

Figure 5:
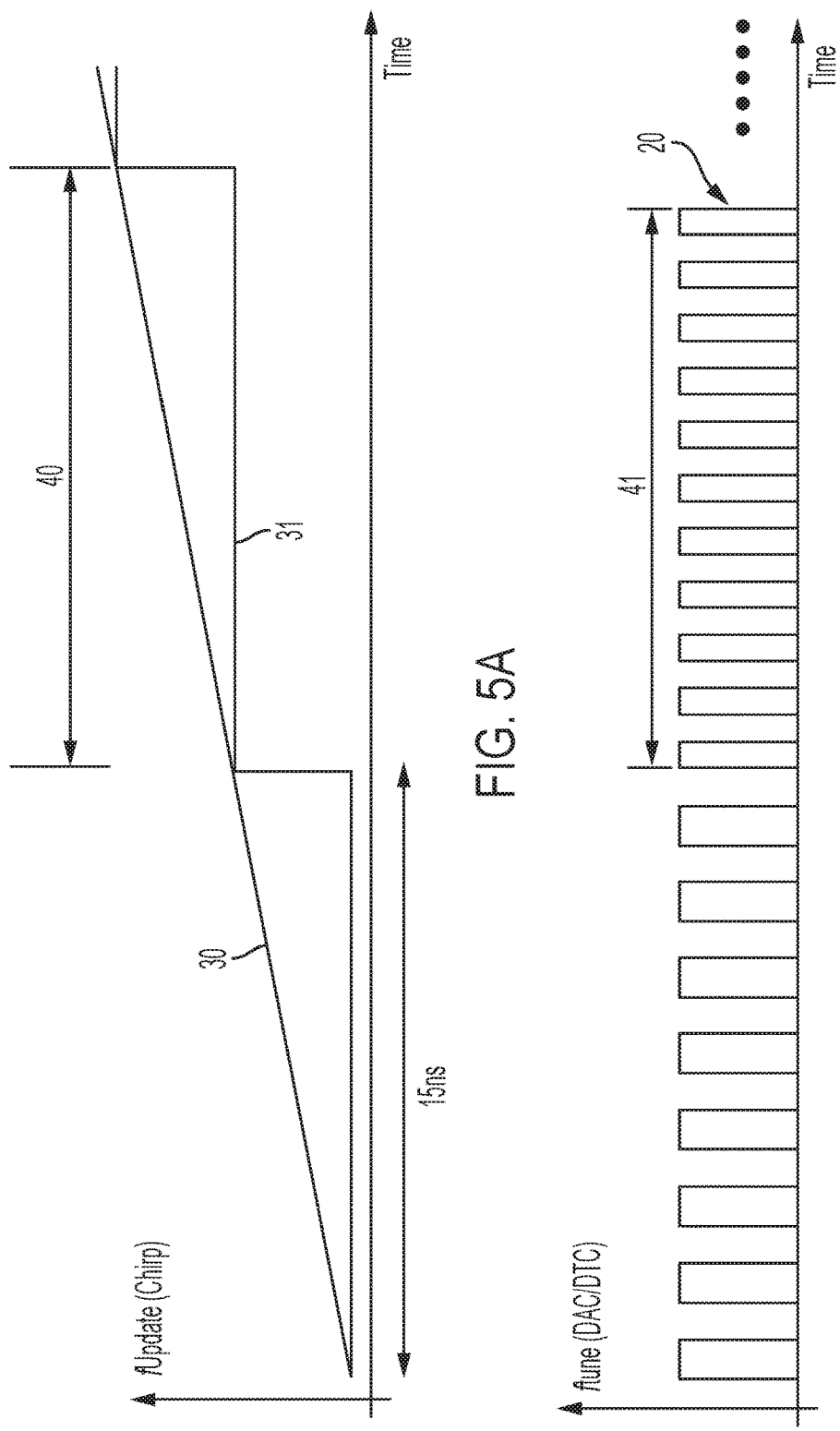
FIGS. 5a and 5b show diagrams illustrating the dependency between reference clock and chirp steps.

The high speed reference clock 25 is adjusted by applying a frequency tuning circuit 600. Digital-to-Time Converters (DTC) or Direct Digital Synthesizers (DDS) may be utilized to adjust the high speed reference frequency properly. The dependency between the high speed reference clock 25 and the chirp update rate is depicted in FIG. 5. As shown in FIG. 5A one frequency step 40 contains several clock cycles 41 of the (tuned) reference signal 20 before the frequency is changed to form the staircase ramp. The loop bandwidth is chosen in the same order of magnitude as the update rate of the frequency steps.

The first PLL 100 operating with high reference frequency provides low phase noise of the synthesizer. The second PLL 200 operates at a lower reference clock which is divided from the high speed reference clock and is similar to the update rate of the FMCW chirp signal 22. The integer-n concept provides fast switching and low noise.

Figure 2:
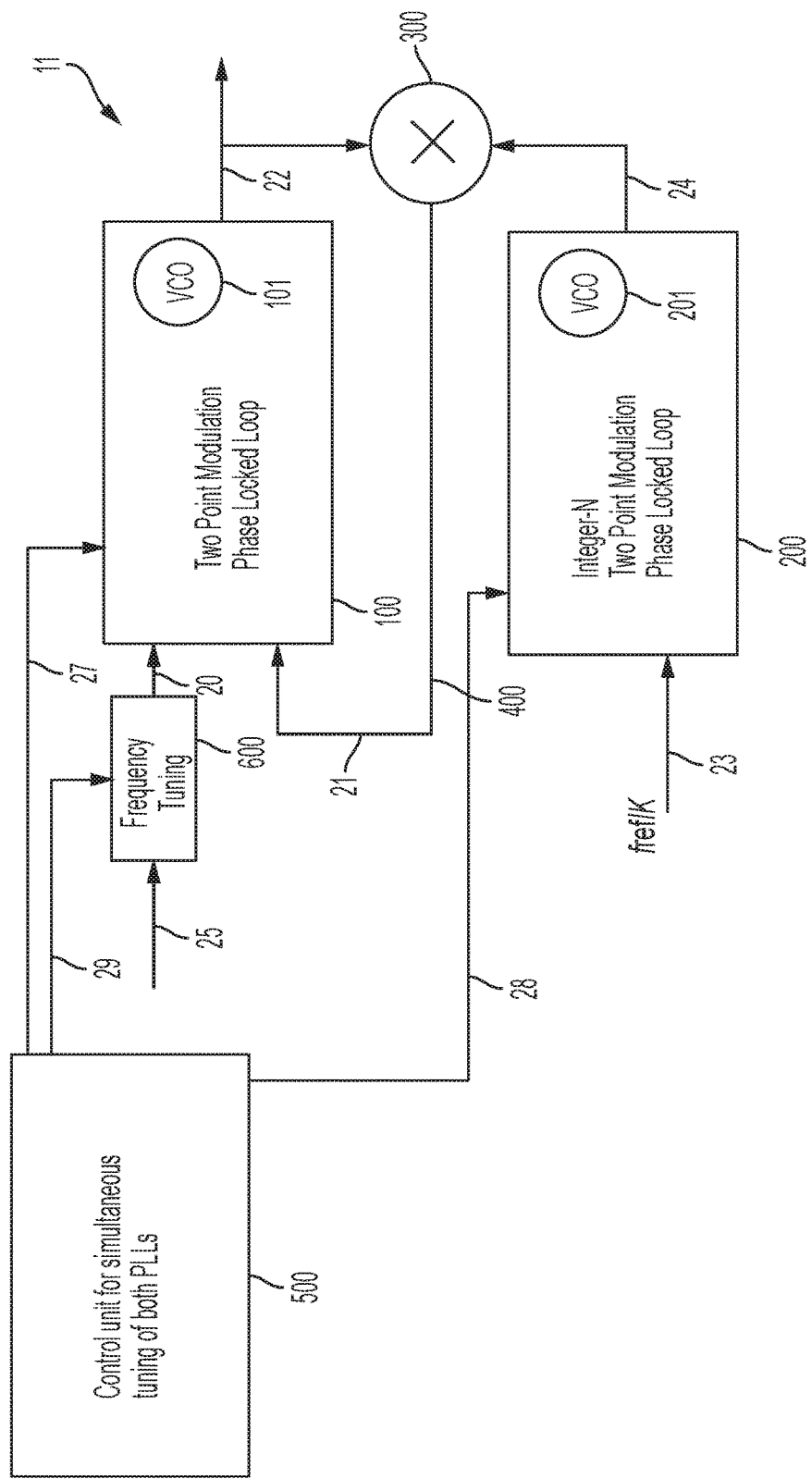
FIG. 2 shows a schematic diagram of a second embodiment of a synthesizer according to the present disclosure.

During one chirp sequence systematic frequency errors may occur, which may lead to spurious signals on beat frequency level. Randomization of the frequency error is achieved by tuning both PLLs 100, 200 simultaneously as provided in a further embodiment schematically shown in FIG. 2.

The PLL modules may generally have at least two injection points to decouple modulation and loop filter bandwidth. Frequency adjustment of the PLLs is preferably achieved by changing the clock frequency with integer numbers.

Figure 6:
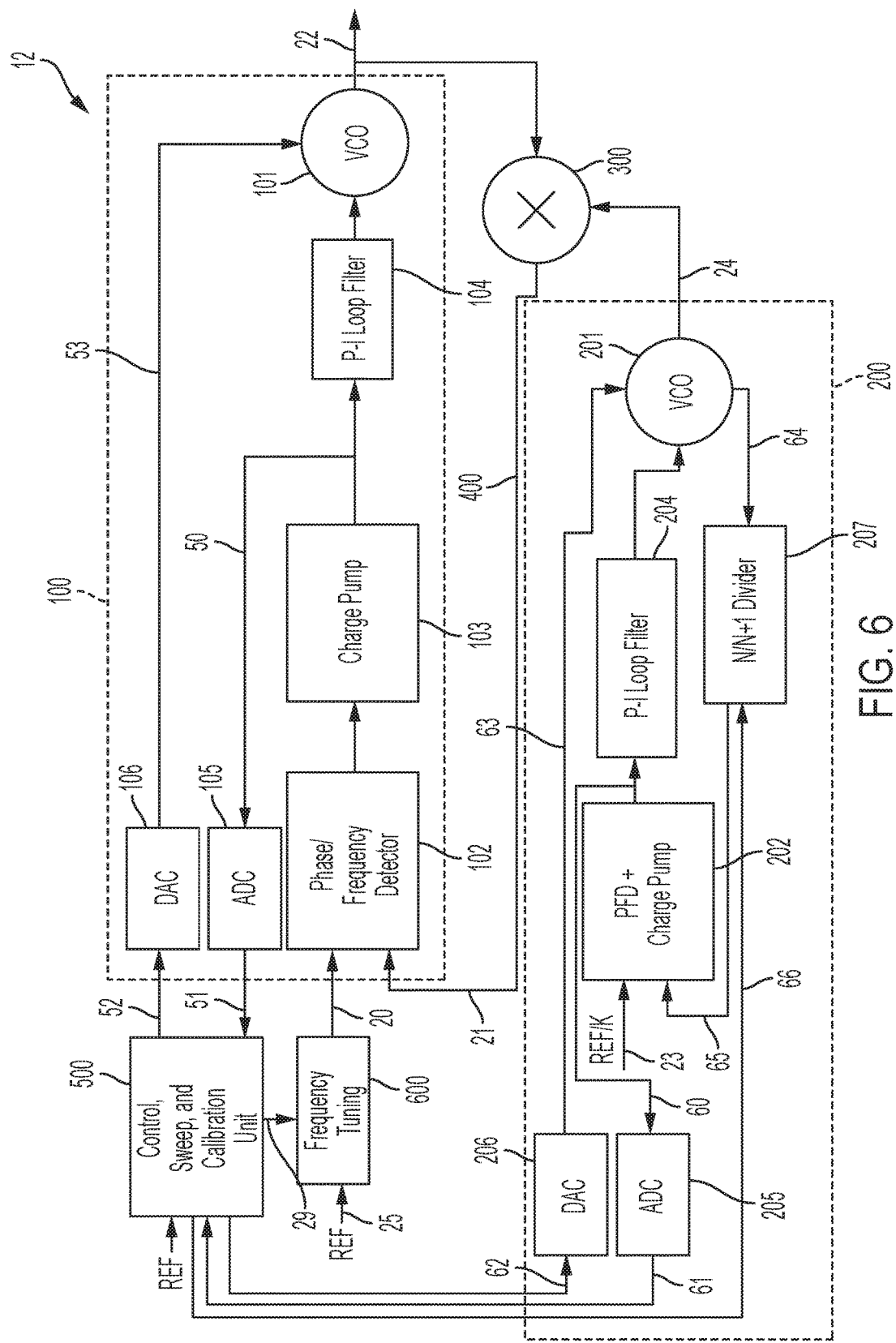
FIG. 6 shows a schematic diagram of a third embodiment of a synthesizer according to the present disclosure.

FIG. 6 shows a schematic diagram of a third embodiment of a synthesizer 12 according to the present disclosure. In the following the PLL 100 which generates the frequency chirp 22 is called chirp PLL and the PLL 200 which produces the local oscillator frequency 24 is called LO PLL.

The local oscillator signal 24 for the downconversion mixer 300 in the feedback loop is provided by the integer-n TPM PLL 200 operating at the update rate of the chirp signal. To reduce the filtering requirements in the feedback path 400 after the mixer 300 an inphase quadrature phase mixer (as mixer 300) may be employed.

Frequency adjustment of the clock signal 20 of the chirp PLL 100 is achieved by the frequency tuning circuit 600, which may be a DTC or DDS operating in integer mode. Consequently, the output frequencies of the frequency tuning circuit 600 and the LO PLL 200 can be changed very quickly and simultaneously.

The control, sweep and calibration unit (also called control unit) 500 adjusts the frequency tuning circuit 600 and the PLL 100 simultaneously to achieve a linear chirp. Randomization techniques can be implemented in the control unit 500 to reduce the impact of the frequency error on the FMCW chirp signal.

The first TPM PLL 100 comprises a phase/frequency detector (PFD) 102, followed by a charge pump 103, a loop filter 104 (e.g. implemented as a P-I loop filter) and the VCO 101. The output signal 50 of the charge pump 103 is provided to an analog-to-digital converter (ADC) 105, providing a digital error signal 51 to the control unit 500. Further, a digital-to-analog converter (DAC) 106 is provided receiving a control signal 52 from the control unit 500 and providing an analog tuning signal 53 to the VCO 101.

In ideal case lookup tables can be applied to adjust the VCO 101 by tuning the signal 53 based on the frequency tuning characteristic of the VCO. In some implementations impairments may occur (e.g. deviations of the VCO tuning curve due to temperature variations). These variations are detected by the digital error signal. The control sweep and calibration unit 500 uses the information of the digital error signal 51 and compensate the impairments by adjusting the digital tuning signal 52.

The second TPM PLL 200 comprises a PFD and charge pump unit 202 (these elements may also be separate units like in the first TPM PLL 100), followed by a loop filter 204 (e.g. implemented as a P-I loop filter and the VCO 201. The output signal 60 of the PFD and charge pump unit 202 is provided to an ADC 205, providing a digital error signal 61 to the control unit 500. Further, a DAC 206 is provided receiving a control signal 62 from the control unit 500 and providing an analog tuning signal 63 to the VCO 201. Further, a divider unit 207 is provided to divide the VCO output signal 64 and provide the divided signal 65 to the PFD and charge pump unit 202 as additional input. The divider unit 207 is also controlled by a control signal 66 from the control unit 500. The sweep and calibration unit 500 adjusts the operating frequency of the second TPM PLL 200 by changing the division ratio in the frequency divider unit 207. Instead of changing the division ratio in the divider unit 207 the tuned reference signal 23 can be adjusted by the frequency tuning circuit 610. Simultaneously to the frequency tuning in the feedback path the operating frequency of the VCO is adjusted by the analog tuning signal 63.

An advantage of the device and method disclosed herein are that the phase noise of the synthesizer is significantly reduced compared to conventional PLL circuits and synthesizers. Fast chirps with very low frequency error are synthesized. The disclosed concept can be integrated in small packages. The synthesizer performance is comparable to large and bulky military radars. The impact of frequency errors in the chirp signal can be compensated by digital techniques.

Thus, the foregoing discussion discloses and describes merely exemplary embodiments of the present disclosure. As will be understood by those skilled in the art, the present disclosure may be embodied in other specific forms without departing from the spirit or essential characteristics thereof.

Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A synthesizer comprising
   a first two-point modulation phase locked loop, TPM PLL, circuit configured to receive a first reference clock signal at a first reference frequency and a feedback signal at a feedback frequency and to generate a first chirp signal in a first mm-wave frequency range by applying a two-point modulation PLL on the first reference clock signal,
   a second integer-n TPM PLL circuit configured to receive a second reference clock signal at a second reference frequency lower than the first reference frequency and to generate a second chirp signal in a second mm-wave frequency range by applying a two-point modulation PLL on the second reference clock signal,
   a mixer configured to downconvert the first chirp signal by the second chirp signal to obtain the feedback signal at the feedback frequency corresponding to the difference of the frequency of the first chirp signal and the second chirp signal, and
   a feedback path configured to feed back the feedback signal to the first TPM PLL circuit.

2. The synthesizer as defined in any preceding embodiment,
   wherein the first reference clock signal is K time larger than the second reference clock signal, wherein K is larger than 1.

3. The synthesizer as defined in embodiment 2,
   wherein K is an integer in the range from 1 to 20, in particular in the range from 3 to 12.

4. The synthesizer as defined in any preceding embodiment,
   further comprising a first frequency tuning circuit configured to tune the first reference clock signal before reception by the first TPM PLL circuit.

5. The synthesizer as defined in any preceding embodiment,
   further comprising a second frequency tuning circuit configured to tune the second reference clock signal before reception by the second TPM PLL circuit.

6. The synthesizer as defined in any preceding embodiment,
   further comprising a control circuit configured to simultaneously adjust the first TPM PLL circuit and the second TPM PLL circuit.

7. The synthesizer as defined in any preceding embodiment,
   wherein the first TPM PLL circuit comprises
   a first phase-frequency detector circuit configured to receive the first reference clock signal and the feedback signal and to generate a first phase detection signal,
   a first loop filter configured to receive the first phase detection signal and to generate a first oscillator control signal and
   a first oscillator configured to receive the first oscillator control signal and to generate the first chirp signal.

8. The synthesizer as defined in any preceding embodiment,
   wherein the second TPM PLL circuit comprises
   a second phase-frequency detector circuit configured to receive the second reference clock signal and a frequency division signal and to generate a second phase detection signal,
   a second loop filter configured to receive the second phase detection signal and to generate a second oscillator control signal,
   a second oscillator configured to receive the second oscillator control signal and to generate the second chirp signal, and
   a frequency divider circuit configured to apply a frequency division on the second chirp signal and to generate the frequency division signal.

9. The synthesizer as defined in embodiment 7 and 8,
   further comprising a control circuit configured to simultaneously adjust the first TPM PLL circuit and the second integer-n TPM PLL circuit.

10. The synthesizer as defined in embodiment 9,
    wherein the control circuit is configured to receive the first reference clock signal, a digital error signal and a second digital error signal and to control the first oscillator, the second oscillator and the frequency divider circuit.

11. The synthesizer as defined in embodiment 10,
    wherein the control circuit is configured to further control a first frequency tuning circuit and/or a second frequency tuning circuit.

The invention claimed is:

1. A synthesizer comprising
   a first two-point modulation phase locked loop, TPM PLL, circuit configured to receive a first reference clock signal at a first reference frequency and a feedback signal at a feedback frequency and to generate a first chirp signal in a first mm-wave frequency range by applying a two-point modulation PLL on the first reference clock signal, a second integer-n TPM PLL circuit configured to receive a second reference clock signal at a second reference frequency lower than the first reference frequency and to generate a second chirp signal in a second mm-wave frequency range by applying a two-point modulation PLL on the second reference clock signal, a mixer configured to downconvert the first chirp signal by the second chirp signal to obtain the feedback signal at the feedback frequency corresponding to the difference of the frequency of the first chirp signal and the second chirp signal, and a feedback path configured to feed back the feedback signal to the first TPM PLL circuit.

2. The synthesizer as claimed in claim 1,
wherein the first reference clock signal is K time larger than the second reference clock signal, wherein K is larger than 1.

3. The synthesizer as claimed in claim 2,
wherein K is an integer in the range from 1 to 20, in particular in the range from 3 to 12.

4. The synthesizer as claimed in claim 1,
further comprising a first frequency tuning circuit configured to tune the first reference clock signal before reception by the first TPM PLL circuit.

5. The synthesizer as claimed in claim 1,
further comprising a second frequency tuning circuit configured to tune the second reference clock signal before reception by the second TPM PLL circuit.

6. The synthesizer as claimed in claim 1,
further comprising a control circuit configured to simultaneously adjust the first TPM PLL circuit and the second TPM PLL circuit.

7. The synthesizer as claimed in claim 1,
wherein the first TPM PLL circuit comprises
    a first phase-frequency detector circuit configured to receive the first reference clock signal and the feedback signal and to generate a first phase detection signal,
    a first loop filter configured to receive the first phase detection signal and to generate a first oscillator control signal and
    a first oscillator configured to receive the first oscillator control signal and to generate the first chirp signal.

8. The synthesizer as claimed in claim 1,
wherein the second TPM PLL circuit comprises
    a second phase-frequency detector circuit configured to receive the second reference clock signal and a frequency division signal and to generate a second phase detection signal,
    a second loop filter configured to receive the second phase detection signal and to generate a second oscillator control signal,
    a second oscillator configured to receive the second oscillator control signal and to generate the second chirp signal, and
    a frequency divider circuit configured to apply a frequency division on the second chirp signal and to generate the frequency division signal.

9. The synthesizer as claimed in claim 7,
further comprising a control circuit configured to simultaneously adjust the first TPM PLL circuit and the second integer-n TPM PLL circuit.

10. The synthesizer as claimed in claim 8,
further comprising a control circuit configured to simultaneously adjust the first TPM PLL circuit and the second integer-n TPM PLL circuit.

11. The synthesizer as claimed in claim 9,
wherein the control circuit is configured to receive the first reference clock signal, a digital error signal and a second digital error signal and to control the first oscillator, the second oscillator and the frequency divider circuit.

12. The synthesizer as claimed in claim 10,
wherein the control circuit is configured to further control a first frequency tuning circuit and/or a second frequency tuning circuit.

\* \* \* \* \*